United States Patent
Toprac (12)

(10) Patent No.: US 6,355,388 B1
(45) Date of Patent: Mar. 12, 2002

(54) METHOD FOR CONTROLLING PHOTORESIST STRIP PROCESSES

(75) Inventor: Anthony J. Toprac, Austin, TX (US)

(73) Assignee: Advanced Micro Devices, Inc., Austin, TX (US)

(*) Notice: Subject to any disclaimer, the term of this patent is extended or adjusted under 35 U.S.C. 154(b) by 0 days.

(21) Appl. No.: 09/414,274

(22) Filed: Oct. 7, 1999

(51) Int. Cl.[7] .............................. G03F 9/00; G03C 5/00
(52) U.S. Cl. ........................................ 430/30; 430/331
(58) Field of Search .................................. 430/30, 331

(56) References Cited

U.S. PATENT DOCUMENTS

| | | | | |
|---|---|---|---|---|
| 4,024,885 A | * | 5/1977 | Linthout | 430/30 |
| 4,882,246 A | * | 11/1989 | Ohba et al. | 430/30 |
| 5,843,602 A | * | 12/1998 | Kotake | 430/30 |
| 5,932,380 A | * | 8/1999 | Yaegashi et al. | 430/30 |

* cited by examiner

Primary Examiner—Christopher G. Young

(57) ABSTRACT

A method for fabricating wafers is provided. A photoresist layer is formed on a wafer. A first thickness of the photoresist layer is measured, and a portion of the photoresist layer is removed. A second thickness of a remainder portion of the photoresist layer is measured. A photoresist strip rate is determined based on the first and second thicknesses, and a recipe of a developer is modified based on the photoresist strip rate. A wafer processing system includes a stepper, a developer, and an automatic process controller. The stepper is adapted to expose a wafer having a photoresist layer deposited thereon. The developer is adapted to remove at least a portion of the photoresist layer based on a recipe. The process controller is adapted to receive a photoresist strip rate and modify the recipe based on the photoresist strip rate.

8 Claims, 4 Drawing Sheets

METHOD FOR CONTROLLING PHOTORESIST STRIP PROCESSES

BACKGROUND OF THE INVENTION

1. Field of the Invention

This invention relates generally to photolithography techniques for patterning semiconductor devices, and, more particularly, to a method for controlling photoresist strip processes.

2. Description of the Related Art

Conventionally, semiconductor devices are patterned using photolithographic processes. A base material, such as a substrate material, a metal, an insulator, etc., is coated with a light sensitive material, referred to as a photoresist material. The photoresist is generally a composition that is sensitive to active rays of light, such as ultraviolet rays, X-rays or electron rays. The photoresist is deposited on the base material to selectively protect non-process portions of the substrate. Light is then selectively directed onto the photoresist film through a photomask, or reticle, to form photoresist patterns on the base material. The photoresist is then developed to remove either the exposed photoresist or the unexposed photoresist.

There are generally two types of photoresist, namely positive type and negative type. The positive photoresist is of such a type that the exposed portion dissolves in the developer, while the unexposed portion does not dissolve therein, and the negative photoresist is of the opposite type. Certain photoresist materials do not complete the transition from being soluble to being insoluble in the developer based solely on the exposure to light. These photoresist materials, referred to as chemically-amplified photoresists, are subjected to a post exposure bake process to complete the chemical reaction to transition from soluble to insoluble (i.e., for a positive resist).

The process of using a chemically-amplified photoresist is described in greater detail in reference to FIGS. 1A through 1D. FIG. 1A shows a wafer 10 including a base material 12 with a photoresist layer 14 deposited thereon. In FIG. 1B, the photoresist layer 14 is exposed to a light source through a photomask (not shown) to define exposed regions 16. Exposure to the light causes hydrogen free radicals to form in the exposed regions 16, which are on the surface of the photoresist layer 14. In FIG. 1C, the wafer 10 is subjected to a post exposure bake to complete the solubility transition chemical reaction and form baked regions 18. During the post exposure bake, the free radicals diffuse downward and react with the photoresist 14 beneath the exposed regions 16. Typically, for a deep UV photoresist layer 14, the post exposure bake time is about 60–90 seconds. As shown in FIG. 1D, a developer may then be applied to remove the remaining photoresist 14 (i.e., for a negative resist—shown in FIG. 1D) or to remove the baked portions 18 (i.e., for a positive resist—not shown).

Typically, the wafer 10 is subject to additional processing, such as deposition of another layer, implantation, etching, etc. using the pattern defined by the photolithography process described above. Following the additional processing; the remaining photoresist (i.e., in the baked regions 18) is stripped using a process such as a plasma etch or a wet etch. The plasma strip tool uses plasma-enhanced, ionized oxygen/oxygen radicals. A wet etch tool typically uses sulfuric acid/peroxide mixes followed by rinses or a sequence of standard cleans.

The photoresist may also be stripped at some point in the photolithography process to allow re-work (e.g., re-coating, exposing, and developing) of the wafer due to poor processing in one of the previous photolithography steps. For example, an overlay or critical dimension measurement performed after one of the intermediate photolithography steps may identify that the photoresist pattern is not suitable for further processing. Such a condition might have been caused by a defect, miscalibration, or other such processing problem in the stepper or developer, for example.

Accurate control of the stripping process is important for preventing defects in the wafer. If the photoresist strip time is too short (i.e., understripping), remnants of the photoresist layer will be present on the wafer, interfering with subsequent processing steps. If the strip time is too long (i.e., overstripping), the wafer may be damaged by unnecessary exposure to ion charging effects, and also the processing time for completing the wafer is lengthened. Typically, a minimum strip time designed to provide a certain amount of overstripping to ensure complete removal of the photoresist is programmed into the recipe of the developer. However, variations in the photoresist, developer, photoresist layer thickness, etc., may result in different photoresist strip rates for various wafers in the same or different lots. Accordingly, a minimum strip time does not always ensure that all of the photoresist is removed. Raising the strip time to encompass such process variations could result in wafer damage and lengthen processing time.

The present invention is directed to overcoming, or at least reducing the effects of, one or more of the problems set forth above.

SUMMARY OF THE INVENTION

One aspect of the present invention is seen in a method for fabricating wafers. A photoresist layer is formed on a wafer. A first thickness of the photoresist layer is measured, and a portion of the photoresist layer is removed. A second thickness of a remainder portion of the photoresist layer is measured. A photoresist strip rate is determined based on the first and second thicknesses, and a recipe of a developer is modified based on the photoresist strip rate.

Another aspect of the present invention is seen in a wafer processing system including a stepper, a developer, and an automatic process controller. The stepper is adapted to expose a wafer having a photoresist layer deposited thereon. The developer is adapted to remove at least a portion of the photoresist layer based on a recipe. The process controller is adapted to receive a photoresist strip rate and modify the recipe based on the photoresist strip rate.

BRIEF DESCRIPTION OF THE DRAWINGS

The invention may be understood by reference to the following description taken in conjunction with the accompanying drawings, in which like reference numerals identify like elements, and in which.

Figure 1A:
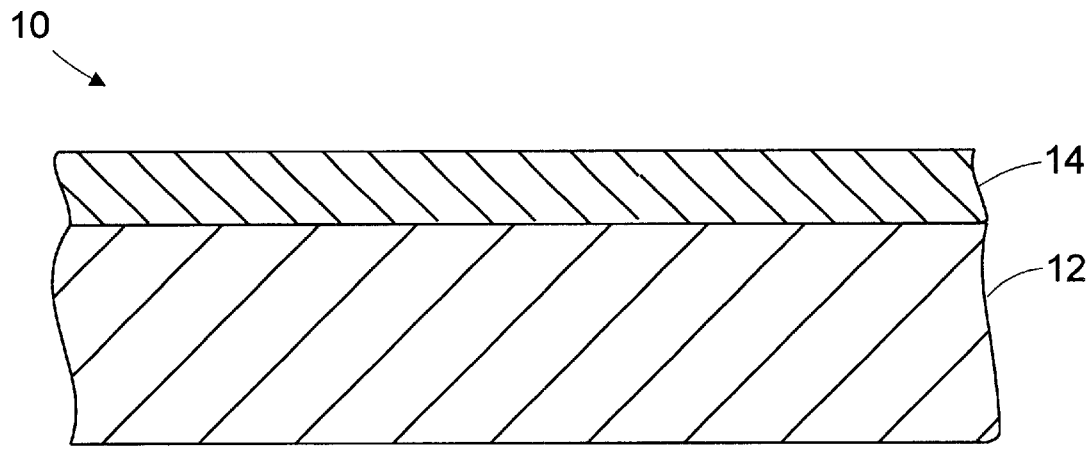
FIG. 1A is a cross-section view of a prior art substrate with a layer of photoresist formed thereon.
Figure 1B:
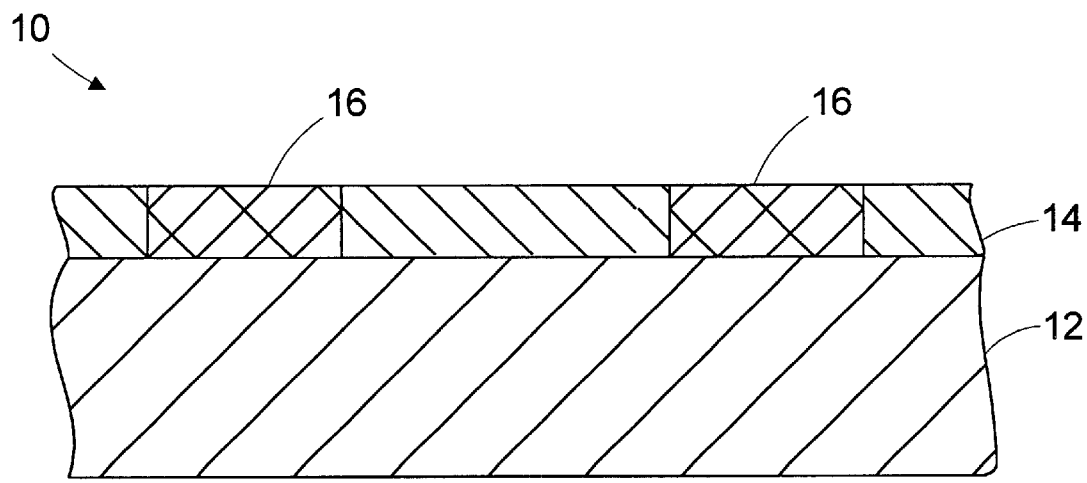
FIG. 1B is a cross-section view of the substrate of FIG. 1A after the photoresist has been exposed to a light source.
Figure 1C:
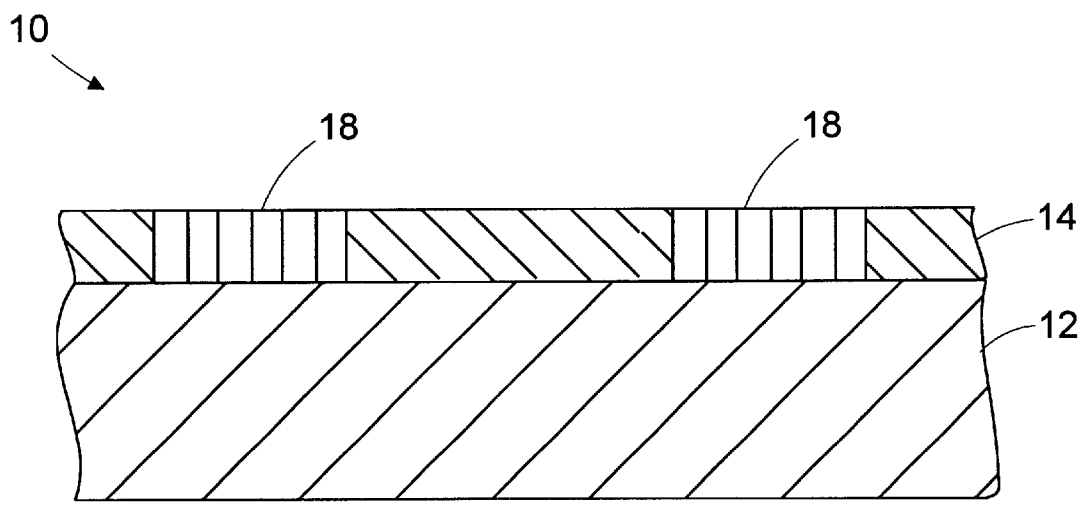
FIG. 1C is a cross-section view of the substrate of FIG. 1B after the substrate has been subjected to a post exposure bake process.
Figure 1D:
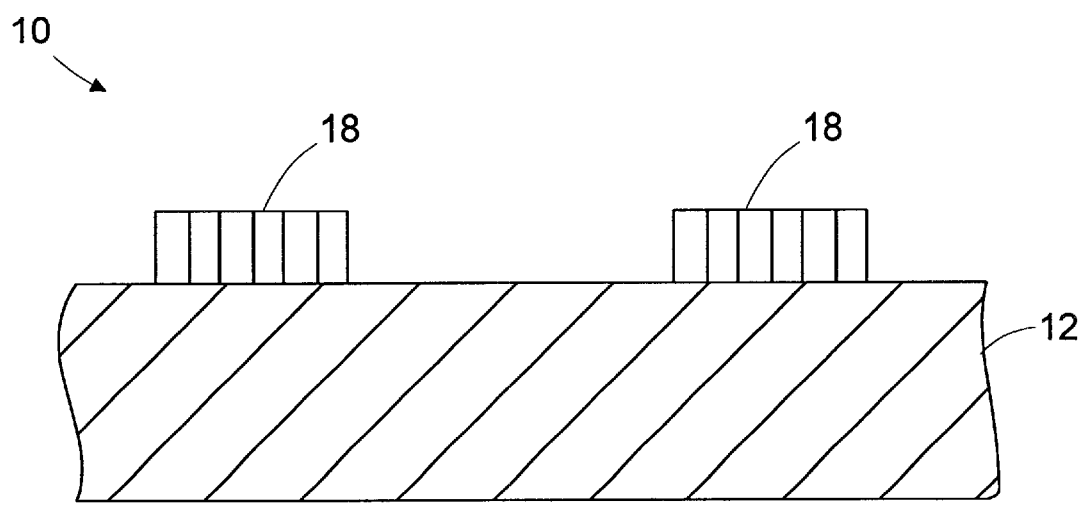
FIG. 1D is a cross-section of the substrate of FIG. 1B after the photoresist has been developed to remove the unexposed portions.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF SPECIFIC EMBODIMENTS

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

Figure 2:
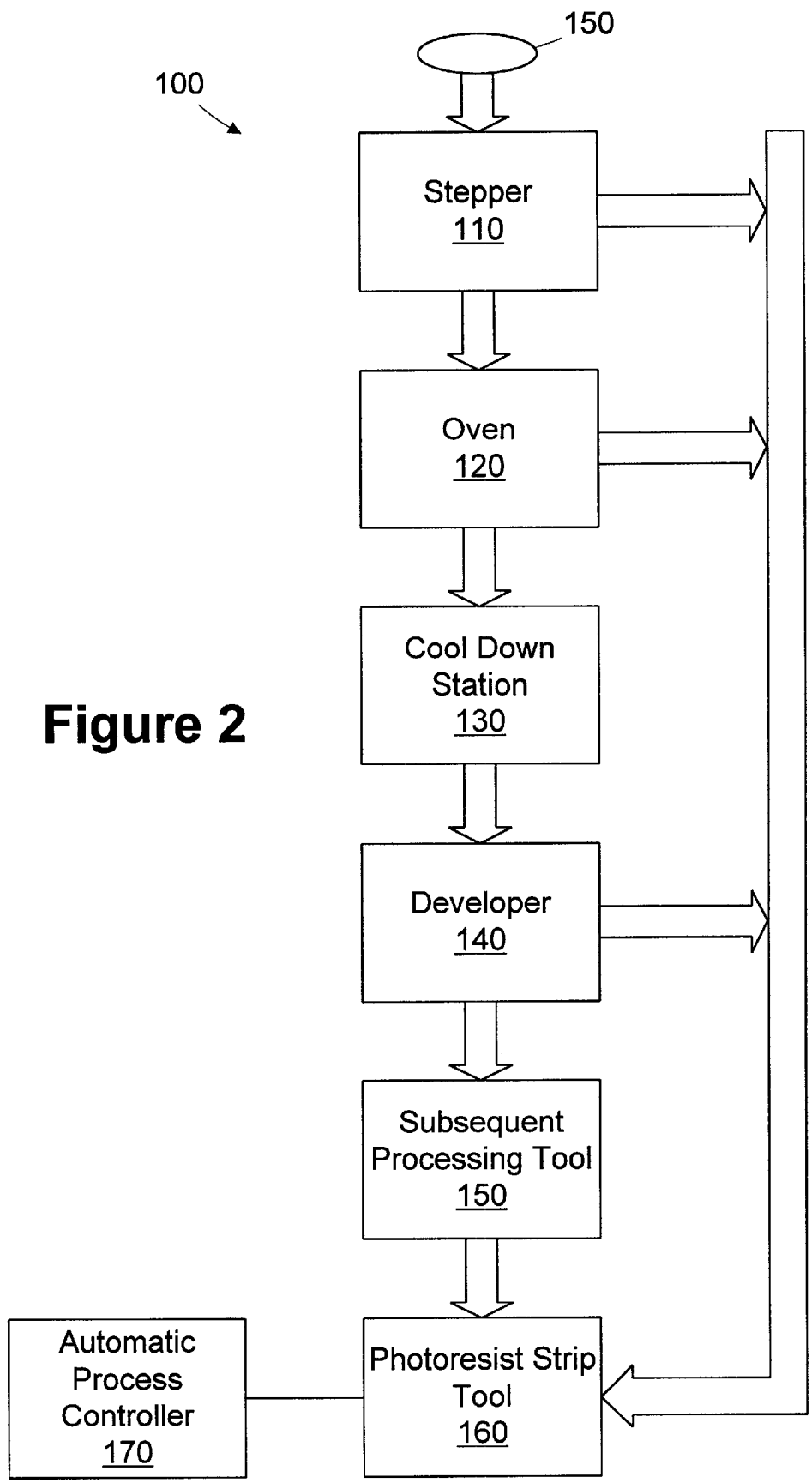
FIG. 2 is a simplified diagram of an illustrative processing line for performing photolithography patterning.

Referring now to the figures, and in particular, to FIG. 2, a simplified diagram of an illustrative processing line 100 for performing photolithography patterning on a wafer 105 is provided. The processing line 100 includes a stepper 110, an oven 120, a cool down station 130, and a developer 140. The stepper 110 exposes the wafer 105 (i.e., or lot of wafers 105) to a light source using a photomask to pattern the wafer 105. The wafer 105 is transferred to the oven 120, where a post exposure bake is conducted. Following the post exposure bake, the wafer 105 is transferred to a cool down station 130, and then to the developer 140, where the unexposed photoresist is removed.

A subsequent processing tool 150 performs additional processing of the wafer 105 using the pattern formed in the photoresist. The specific process performed by the subsequent processing tool 150 is immaterial to the practice of the instant invention, however, exemplary subsequent processing steps may include deposition of an additional layer, implantation, etching, etc. Following the subsequent processing in the subsequent processing tool 150, the wafer 105 is transferred to a photoresist strip tool 160 where remnants of the patterned photoresist layer are removed.

The wafer 105 may also be transferred to the photoresist strip tool 160 after one of the intermediate steps in the process line 100 to allow re-work (e.g., re-coating, exposing, and developing) of the wafer 105 due to poor processing in one of the previous photolithography steps. For example, an overlay or critical dimension measurement performed after one of the intermediate photolithography steps may identify that the photoresist pattern is not suitable for further processing. Such a condition might have been caused by a defect, miscalibration, or other such processing problem in the stepper 110, oven 120, or developer 140, for example.

An automatic process controller 170 interfaces with at least the photoresist strip tool 160 to modify its operating recipe based on manual or automatic (i.e., software) input. In the illustrated embodiment, the automatic process controller 170 receives a photoresist strip rate input, as described in greater detail below, and adjusts the recipe of the photoresist strip tool 160 to account for strip rate variations or trends. As will be recognized by those of ordinary skill in the art in light of this disclosure, the processing line 100 may include discrete or integrated processing tools for performing the processing steps described herein.

Figure 3:
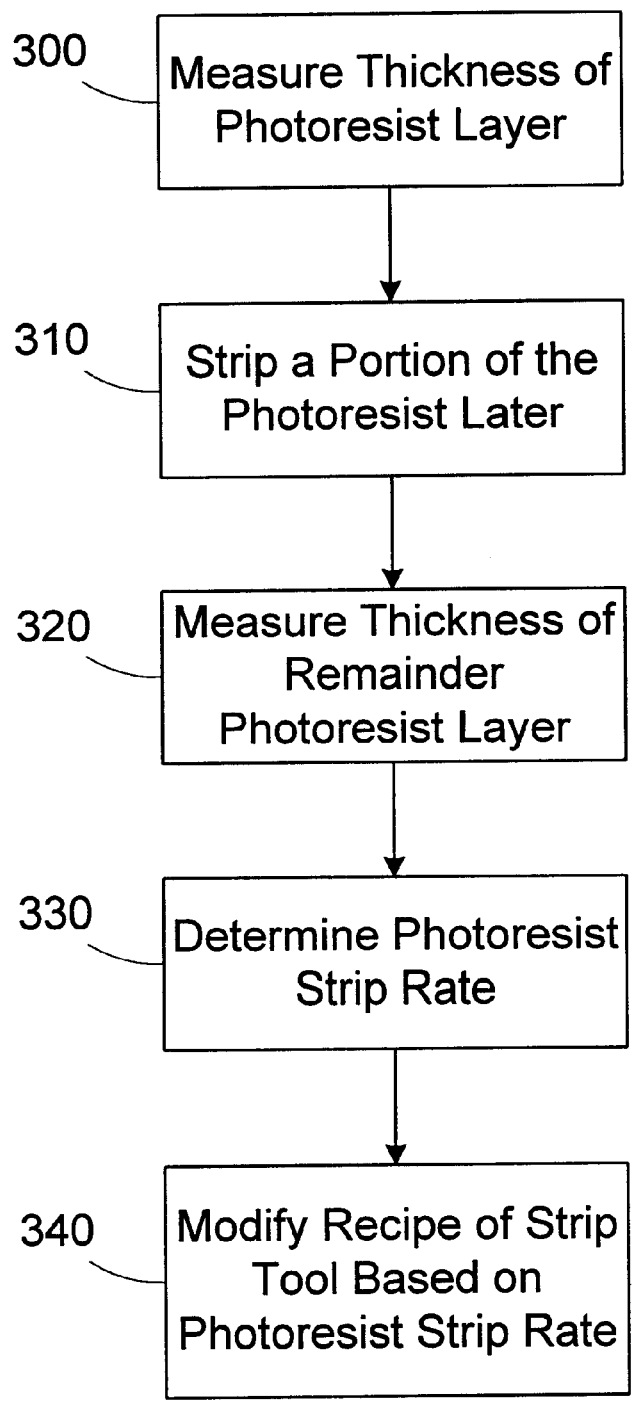
FIG. 3 is a flow diagram of a method for developing a wafer.

Turning now to FIG. 3, a flow diagram of a method for stripping a photoresist layer is provided. In block 300, the thickness of the photoresist layer is measured. A portion of the photoresist layer is stripped in block 310, leaving a remainder photoresist layer. The thickness of the remainder photoresist layer is measured in block 320. In block 330, a photoresist strip rate is determined based on the thicknesses of the photoresist layer, the remainder photoresist layer, and the time required to remove the portion of the photoresist layer. In block 340, the recipe of the photoresist strip tool 160 is modified based on the photoresist strip rate so determined. The modified recipe may be used in ensuing processing of the same wafer 105, or in processing of subsequent wafers 105.

In the case where the photoresist strip tool 160 uses a wet etch stripping process, the recipe may be modified to change the etch time or the etchant concentration, for example. In the case where the photoresist strip tool 160 uses a plasma etch process, the recipe may be modified to change the strip time, RF power, or gas flow rate.

Metrology tools for determining the thickness of the photoresist layer and remainder photoresist layer are known in the art. For example, an Opti-Probe tool sold by ThermaWave, Inc. of Fremont, Calif. may be used.

There are numerous advantages for determining the photoresist strip rate. The efficiency of the processing line 100 is determined in part by the time the wafers 105 spend in the photoresist strip tool 160. An accurate determination of the minimum time required to complete the photoresist strip may increase this efficiency by allowing the strip time to be shortened without increasing the defect rate. Accurate knowledge of the photoresist strip rate also allows adjustments for variations caused by factors such as different photoresist lots, variations in the developer concentration, etc.

In the illustrated embodiment, the photoresist strip rate is determined periodically and communicated automatically (i.e., by metrology equipment—not shown) or manually (i.e., by the metrology equipment operator) to the automatic process controller 170. Depending on the characteristics of the processing line 100, the strip rate determination may be conducted on one or more wafers 105 in a lot, one wafer 105 per shift, one wafer 105 per day, one wafer 105 per week, etc. The photoresist strip rate may be determined using a blank wafer (i.e., no underlying topology, or alternatively, using a production wafer. The wafer 105 may or may not have the same photoresist pattern formed thereon.

It is also contemplated that in certain situations, where excessive strip may be detrimental to the device being manufactured, the strip rate may be determined for every wafer 105. For example, after a portion of the photoresist layer is removed and the strip rate is determined, the wafer 105 may be returned to the photoresist strip tool 160 to remove the remainder photoresist layer using an end point determined by the measured thickness of the remainder photoresist layer and the photoresist strip rate.

The particular embodiments disclosed above are illustrative only, as the invention may be modified and practiced in different but equivalent manners apparent to those skilled in the art having the benefit of the teachings herein. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method for fabricating wafers, comprising:

forming a photoresist layer on a wafer;

measuring a first thickness of the photoresist layer;

stripping a portion of the photoresist layer in a photoresist strip tool;

measuring a second thickness of a remainder portion of the photoresist layer;

determining a photoresist strip rate based on the first and second thicknesses; and modifying a recipe of the photoresist strip tool based on the photoresist strip rate.

2. The method of claim 1, further comprising removing the remainder portion based on the photoresist strip rate.

3. The method of claim 1, further comprising processing subsequent wafers in the photoresist strip tool based on the photoresist strip rate.

4. The method of claim 1, wherein modifying the recipe includes modifying a strip time based on the photoresist strip rate.

5. The method of claim 1, wherein the photoresist strip tool comprises a plasma etch tool and modifying the recipe includes modifying at least one of a strip time, an RF power level, and a gas flow rate.

6. A method for fabricating wafers, comprising:

forming a first photoresist layer on a first wafer;

removing at least a portion of the first photoresist layer during a time interval;

determining a photoresist strip rate based on the time interval;

forming a second photoresist layer on a second wafer; and removing at least a portion of the second photoresist layer based on the photoresist strip rate.

7. The method of claim 6, further comprising exposing at least a portion of the second photoresist layer to define a photoresist pattern of unexposed and exposed regions.

8. The method of claim 7, wherein removing the portion of the second photoresist layer includes removing at least a portion of the unexposed regions.

* * * * *